United States Patent
Kim

(10) Patent No.: US 9,634,466 B2
(45) Date of Patent: Apr. 25, 2017

(54) EXTERNAL-CAVITY TYPE LASER WITH BUILT-IN WAVEMETER

(71) Applicant: PHOVEL.CO.LTD., Yuseong-gu, Daejeon (KR)

(72) Inventor: Jeong-Soo Kim, Gongju-si (KR)

(73) Assignee: PHOVEL.CO.LTD., Yuseong-Gu, Daejeon (KR)

( * ) Notice: Subject to any disclaimer, the term of this patent is extended or adjusted under 35 U.S.C. 154(b) by 0 days.

(21) Appl. No.: 14/908,749

(22) PCT Filed: May 12, 2014

(86) PCT No.: PCT/KR2014/004176
§ 371 (c)(1),
(2) Date: Jan. 29, 2016

(87) PCT Pub. No.: WO2015/016468
PCT Pub. Date: Feb. 5, 2015

(65) Prior Publication Data
US 2016/0181763 A1 Jun. 23, 2016

(30) Foreign Application Priority Data

Jul. 30, 2013 (KR) .................. 10-2013-0089986

(51) Int. Cl.
*H01S 5/14* (2006.01)
*H01S 5/022* (2006.01)
*H01S 5/0687* (2006.01)

(52) U.S. Cl.
CPC .......... *H01S 5/141* (2013.01); *H01S 5/02212* (2013.01); *H01S 5/02292* (2013.01); *H01S 5/0687* (2013.01)

(58) Field of Classification Search
CPC ... H01S 5/141; H01S 5/02212; H01S 5/02292
See application file for complete search history.

(56) References Cited

U.S. PATENT DOCUMENTS 6,801,553 B2    10/2004  Imaki et al.
2015/0030042 A1*   1/2015  Kim .................. H01S 5/02292
                                                                        372/20

FOREIGN PATENT DOCUMENTS

JP    2002-237651 A    8/2002
JP    2006-165598 A    6/2006
(Continued)

OTHER PUBLICATIONS

International Search Report Corresponding to PCT/KR2014/004176 mailed Aug. 21, 2014.

*Primary Examiner* — Dung Nguyen
(74) *Attorney, Agent, or Firm* — Davis & Bujold PLLC; Michael J. Bujold

(57) ABSTRACT

The present invention relates to an external cavity type laser provided with a wavemeter capable of precisely measuring a wavelength of a laser beam based on a transmission wavelength band of a wavelength selective filter inserted into a cavity regardless of a driving current of a laser diode chip. The external cavity type laser apparatus includes: a laser diode chip 100 emitting a laser beam; a beam feedback partial reflection mirror 500 reflecting a portion of the beam emitted from the laser diode chip 100 to feed the beam back to the laser diode chip 100; a collimating lens 200 installed on a path of a beam between the laser diode chip 100 and the beam feedback partial reflection mirror 500 to collimate the beam emitted from the laser diode chip 100; a 45-degree partial reflection mirror 300 converting a laser beam moving in parallel with a package bottom surface into a laser beam moving perpendicularly to the package bottom surface; a wavelength selective filter 400 transmitting a beam having a selected specific wavelength therethrough; a beam strength monitoring photodiode 600 disposed on a path of a beam moving from the collimating lens 200 to the 45-degree (Continued)

partial reflection mirror 300 and transmitting through the 45-degree partial reflection mirror 300; and a wavelength monitoring photodiode 700 disposed on a path of a beam moving from the wavelength selective filter 400 to the 45-degree partial reflection mirror 300 and transmitting through the 45-degree partial reflection mirror 300. A magnitude of a photocurrent flowing to the wavelength monitoring photodiode 700 is changed depending on a strength of a beam output oscillated in the laser diode chip 100 and a reflectivity at the wavelength selective filter 400, and a photocurrent flowing to the beam strength monitoring photodiode 600 is determined by the strength of the beam output outputted from the laser diode chip 100. Therefore, a value obtained by dividing the photocurrent flowing to the wavelength monitoring photodiode 700 by the photocurrent flowing to the beam strength monitoring photodiode 600 depends on only the reflectivity at the wavelength selective filter 400. Therefore, the value obtained by dividing the photocurrent flowing to the wavelength monitoring photodiode 700 by the photocurrent flowing to the beam strength monitoring photodiode 600 provides information on the wavelength of the laser beam based on the transmission band wavelength of the wavelength selective filter 400, and the wavelength of the laser beam may be figured out by measuring the value, and may be very precisely determined to be a predetermined wavelength.

8 Claims, 4 Drawing Sheets

(56) References Cited

FOREIGN PATENT DOCUMENTS

| KR | 100871011 B1 | | 11/2008 |
|----|----|----|----|
| KR | 10-2011-0094376 | * | 8/2011 |
| KR | 10-2011-0094376 A | | 8/2011 |
| KR | 10-2013-0083765 A | | 7/2013 |

* cited by examiner

EXTERNAL-CAVITY TYPE LASER WITH BUILT-IN WAVEMETER

TECHNICAL FIELD

The present invention relates to an external cavity type laser with a wavemeter, and more particularly, to an external cavity type laser with a TO type wavemeter.

BACKGROUND ART

Recently, communication services of which a communication capacity is very large, including a video of a smart phone, or the like, have been released. Therefore, the necessity to increase an existing communication capacity is emerging, and a dense wavelength division multiplexing (DWDM) communication method has been adopted as a method of increasing the communication capacity using an optical fiber buried in advance. The DWDM communication method indicates a method of simultaneously transmitting beams having several wavelengths by one optical fiber using a phenomenon that laser beams having different wavelengths do not interfere with each other, such that interference between beam signals is not generated even though the beam signals having several wavelengths are simultaneously transmitted through one optical fiber. In the DWDM communication method recently used in optical communication, an interval of 100 GHz or 50 GHz has been used as a frequency interval of a beam, and this frequency interval has a wavelength interval of about 0.8 nm, or 0.4 nm in a wavelength band of 1.55 μm.

In the DWDM communication method, communication wavelengths of at least 32 to 40 channels are present in a C-band (1520 to 1560 nm), and 20 more kinds of DFB-LD chip which is applied communication wavelengths of at least 32 to 40 channels sets are required The DFB-LDs are subjected to a complicated semiconductor manufacturing process, and each of the DFB-LDs has different specific wavelengths. Therefore, it was difficult to implement chip sets corresponding to all DWDM channels using the DFB-LD chips. In order to solve this problem, the present inventor has suggested a transistor outline (TO) type external cavity laser structure of which a wavelength is determined at the outside in Korean Patent Publication No. 10-1124173. The external cavity type laser, which is a method of determining an oscillation wavelength of the semiconductor laser at the outside of a semiconductor laser diode chip, may allow the semiconductor laser to have several wavelengths depending on a method of determining the wavelength at the outside, or allow oscillation to be generated at only a specific wavelength. Generally, the external cavity type laser has been mounted and implemented in a package housing called a butterfly package. The butterfly package has a very large volume, and a cost of the package housing itself is very expensive.

In a description of the present invention, in the external cavity type laser, a semiconductor diode chip acts as only a gain chip providing a gain before a laser operation occurs, and may be called a laser diode chip in the case in which the gain chip is wavelength-locked to a wavelength selected at the outside to perform the laser operation. However, although amplification is generated at the wavelength selected at the outside, such that the wavelength is locked, there is no change in an external structure acting as a gain medium before the wavelength is locked. Therefore, in the present invention, concepts of the gain chip and the laser diode chip will be used together.

As a method of implementing the external cavity type laser in a TO type package, Korean Patent Publication No. 10-1121173 invented by the present inventor illustrates a method of manufacturing the external cavity type laser using the TO type package. FIG. 1 illustrates a structural view of Korean Patent Publication No. 10-1124173 invented by the present inventor. However, in this method, an oscillation wavelength is finely changed depending on an internal temperature or a magnitude of a current flowing to the laser diode chip.

FIG. 2 illustrates characteristics according to the related art that the oscillation wavelength is changed depending on a change in a temperature of a thermoelectric element mounted in the TO type package in the structure of FIG. 1 as described in Korean Patent Publication No. 10-1124173. It may be appreciated in FIG. 2 that a laser oscillation wavelength is not stable, but is vibrated in a wavelength range of 100 pm, depending on a change in an environment in the external cavity type TO type laser structure.

Currently, in the DWDM, a wavelength interval tends to be gradually narrowed to 100 GHz, 50 GHz, and 25 GHz, and a more precise wavelength control is required so that wavelength stability is +/−100 pm, +/−50 pm, and +/−25 pm for the purpose of the DWDM of this wavelength interval.

The TO type external cavity type laser according to the related art including Korean Patent Publication No. 10-1124173 does not have any wavemeter, such that it may not stabilize the wavelength of a laser beam emitted from the TO type laser. Therefore, it is difficult to apply the TO type external cavity type laser according to the related art to an application in which more precise wavelength control is required.

RELATED ART DOCUMENT

Patent Document (Patent Document 1): Korean Patent Publication No. 10-1124173 (2012 Feb. 29)

DISCLOSURE

Technical Problem

An object of the present invention is to provide a wavelength measuring function to an external cavity type laser, and is further to provide a wavemeter to an external cavity type laser having a TO type subminiature laser package.

Technical Solution

According to an exemplary embodiment of the present invention, an external cavity type laser diode package includes: a laser diode chip emitting a laser beam; a beam feedback partial reflection mirror reflecting a portion of the beam emitted from the laser diode chip to feed the beam back to the laser diode chip; a collimating lens installed on a path of a beam between the laser diode chip and the beam feedback partial reflection mirror to collimate the beam, emitted from the laser diode chip; a wavelength selective filter transmitting a beam having a selected specific wavelength therethrough; a 45-degree partial reflection mirror converting a laser beam moving in parallel with a package bottom surface into a laser beam moving perpendicularly to the package bottom surface and having partial reflection characteristics; a photodiode disposed on a path of the beam emitted from the laser diode chip and transmitting through the 45-degree partial reflection mirror; and a photodiode disposed below the 45-degree partial reflection mirror.

The beam feedback partial reflection mirror may be disposed above the 45-degree partial reflection mirror.

The laser diode chip, the collimating lens, the wavelength selective filter, the 45-degree partial reflection mirror, and the beam feedback partial reflection mirror may be fixed and attached onto a thermoelectric element, and be disposed in a transistor outline (TO) type package.

A reflectivity of the 45-degree partial reflection mirror may be 80% to 98%, and a reflectivity of the beam feedback partial reflection mirror may be 20 to 50%.

The wavelength selective filter may be formed by alternatively stacking dielectric thin films having high and low refractive indices on any one surface thereof through which the laser beam transmits or be manufactured in a form in which a GaAs/AlGaAs semiconductor layer is deposited on a GaAs substrate, and a half width of a transmission wavelength band of the wavelength selective filter may be 0.05 nm to 1 nm.

An inner portion of a package housing in which the laser diode chip, the collimating lens, the wavelength selective filter, the 45-degree partial reflection mirror, and the beam feedback partial reflection mirror are disposed may be maintained in a vacuum state of 0.2 atmosphere or less, and the collimating lens may be attached onto an upper surface of the thermoelectric element or be fixed and attached onto a side surface of a sub-mount for the laser diode chip fixing the laser diode chip.

Advantageous Effects

In the present invention, a photocurrent that is in proportion to the laser beam emitted from the laser diode chip flows to the photodiode disposed on the path of the beam transmitting through the 45-degree partial reflection mirror, and a photocurrent including characteristics that a wavelength of the laser beam emitted from the laser diode chip transmits through/is reflected on the wavelength selective filter flows to the photodiode disposed below the 45-degree partial reflection mirror, such that the photocurrents flowing to the two photodiodes are compared with each other, thereby making it possible to measure the wavelength of the laser beam based on the transmission wavelength of the wavelength selective filter, and the transmission wavelength of the wavelength selective filter may be very precisely determined in advance by only the temperature of the wavelength selective filter regardless of the current flowing to the laser diode chip and the temperature of the laser diode chip. In order to measure and adjust the wavelength of the laser beam in this structure, the wavelength of the laser beam may be precisely adjusted by adjusting the temperature of the thermoelectric element included in the TO type package so that a ratio between the photocurrents of the two photodiodes has a predetermined value.

BEST MODE

Hereinafter, non-restrictive exemplary embodiments of the present invention will be described in detail with reference to the accompanying drawings.

Figure 1:
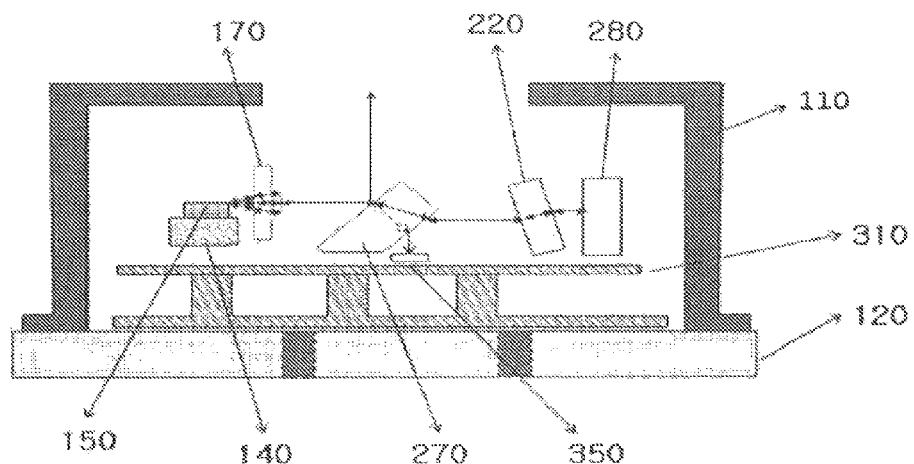
FIG. 1 is a view illustrating a schematic form of an external cavity TO type package according to the related art.
Figure 2:
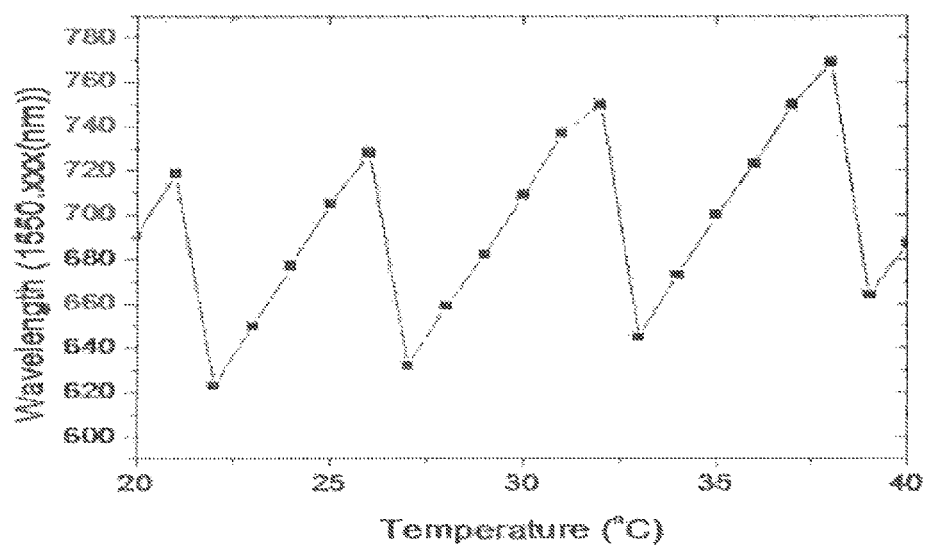
FIG. 2 is an example of data illustrating a relationship between a change in a temperature of a thermoelectric element in the external cavity TO type package according to the related art and a change in an outer output wavelength.

FIG. 1 is a structural view of the external cavity TO type laser package according to the related art, as described above. In the structure of FIG. 1 described above, when a temperature of a thermoelectric element 310 is changed, a wavelength is changed. In addition, when a current flowing to a laser diode chip 150 is changed, an oscillation wavelength is changed even at the same temperature of the thermoelectric element. This change in the wavelength is illustrated in FIG. 2.

In the structure according to the related art of FIG. 1, a photodiode chip 350 for monitoring an output of a laser diode chip 150 is disposed below a 45-degree partial reflection mirror 270. In the present structure, the photodiode chip 350 monitors a laser beam oscillated in the laser diode chip 150, transmitting through a collimating lens 170, transmitting through the 45-degree partial reflection mirror 270, transmitting through a wavelength selective filter 220, reflected on a beam feedback reflection mirror 280, transmitting through the wavelength selective filter 220, and reflected on the 45-degree partial reflection mirror 270, thereby detecting a signal that is in proportion to a strength of a laser beam output from the laser.

Therefore, in the structure of FIG. 1, only the strength of the laser beam emitted from the laser diode chip may be monitored, and information related to a wavelength of the laser beam may not be obtained.

Figure 3:
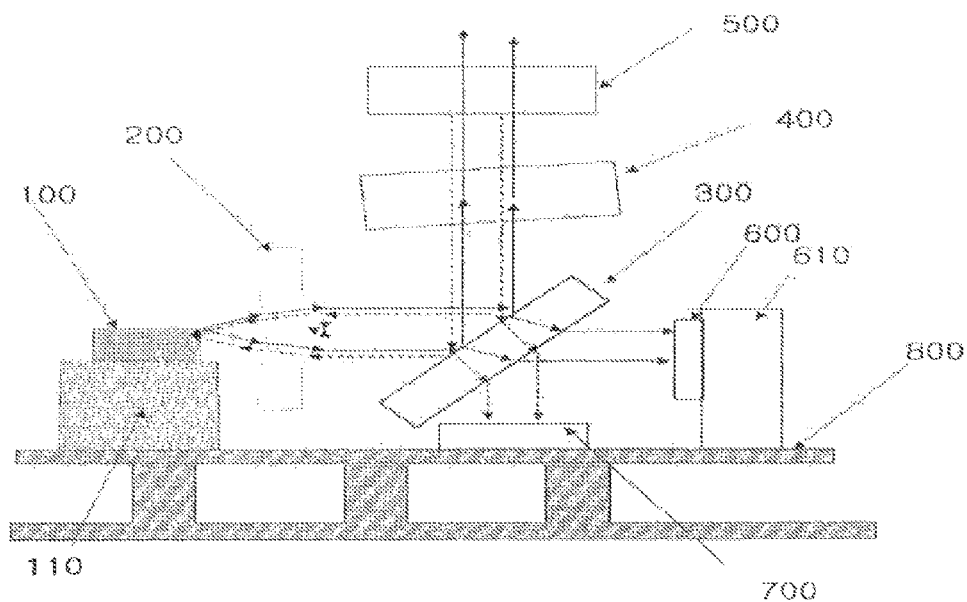
FIG. 3 is a structural view of an external cavity TO type package having a wavelength monitoring function according to the present invention.

FIG. 3 is a schematic view of an external cavity TO type package having a wavelength stabilizer according to the present invention. In FIG. 3, a stem and a cap of a TO type package are not illustrated.

As illustrated in FIG. 3, an external cavity type laser diode package including a wavemeter according to the present invention includes a laser diode chip 100 installed on a sub-mount 110 for the laser diode chip, a laser beam emitted from the laser diode chip 100 is collimated while transmitting through a collimating lens 200, and is divided into two branches by a 45-degree partial reflection mirror 300 transmitting a beam corresponding to a predetermined ratio in am incident laser beam therethrough and reflecting a beam corresponding to a predetermined ratio. Here, the 45-degree partial reflection mirror 300 has a reflectivity of about 80 to 98%. Therefore, most of the beam emitted from the laser diode chip 100 and incident to the 45-degree partial reflection mirror 300 is incident to a wavelength selective filter above the 45-degree partial reflection mirror 300. The beam transmitting through the 45-degree partial reflection mirror is incident to a laser beam strength monitoring photodiode 600 (hereinafter, referred to as a PMPD) to allow a photocurrent that is in proportion to the strength of the laser beam to flow to the PMPD. Most of the beam emitted from the laser diode chip 100, transmitting through the collimating lens 200, and reflected on the 45-degree partial reflection mirror 300 is incident to the wavelength selective filter 400 selectively transmitting a beam, having a specific wavelength therethrough. It is preferable that an incident surface of the wavelength selective filter 400 is misaligned with a laser optical axis by one degree or more so that the beam reflected on the wavelength selective filter 400 is not again fed back to the laser diode chip 100. Since a beam oscillation region of the laser diode chip is small (about 1 to 2 µm), even though the incident surface of the wavelength selective filter 400 has a small angle of about one degree with respect to the optical axis, the beam is not fed back to the laser diode chip. Some of components of the beam oscillated from the laser diode chip 100, transmitting through the collimating lens 200, reflected on the 45-degree partial reflection mirror 300, and then transmitting through the wavelength selective filter 400 transmits through a beam feedback partial reflection mirror 500 and is then used in optical communication. A beam reflected on the beam feedback partial reflection mirror 500 again transmits through the wavelength selective filter 400 and arrives at the 45-degree partial reflection mirror 300. A beam incident from the wavelength selective filter 400 to the 45-degree partial reflection mirror 300 again transmits through the 45-degree partial reflection mirror 300 by a predetermined ratio, and is incident to a wavelength monitoring photodiode 700 (hereinafter, referred to as an FMPD) disposed below the 45-degree partial reflection mirror 300, thereby allowing a photocurrent having information on a transmission component of the wavelength selective filter to flow to the FMPD 700. A beam corresponding to a component reflected on the 45-degree partial reflection mirror 300 in the beam moving from the wavelength selective filter 400 to the 45 degree partial reflection mirror 300 transmits through the collimating lens 200 and is fed back to the laser diode chip 100 to lock an oscillation wavelength of the laser diode chip 100 to a wavelength selected in the wavelength selective filter 400, such that the TO type external cavity type laser is completed.

The laser diode chip 100 is an edge emitting type laser diode chip. The edge emitting type laser diode chip 100 emits a laser beam from both cut surfaces thereof. A cut surface toward the beam feedback partial reflection mirror 500, of both cut surfaces of the laser diode chip 100 is an anti-reflective coating surface (anti-reflective surface) having a reflectivity of 1% or less. The anti-reflective surface has the reflectivity of 1% or less, preferably, a reflectivity of 0.1% or less, more preferably, a reflectivity of 0.01% or less. A cut surface of the laser diode chip 100 opposite to the anti-reflective surface generally has a reflectivity of 1% or more, preferably, a reflectivity of 10% or more, more preferably, a reflectivity of 80% or more. Since a beam is not fed back in the laser diode chip 100 of which one of the cut surfaces is antireflection-coated, a Fabry-Perot mode in which the laser diode chip 100 is used as a resonator is not formed. The beam emitted from the laser diode chip 100 shows a wavelength of a beam having a very wide wavelength band (generally, a half width of 20 nm or more). The beam in the wide wavelength band emitted through the anti-reflective surface of the laser diode chip 100 is collimated as a parallel beam by the collimating lens 200. The beam in the wide wavelength band collimated by the collimating lens 200 transmits through the 45-degree partial reflection mirror 300 and is incident to the narrow wavelength selective filter 400. The remainder except a beam transmitting through the wavelength selective filter 400 in the beam incident to the wavelength selective filter 400 is reflected by the wavelength selective filter 400 to thereby be transmitted to another path through which it is not fed back to the laser diode chip 100. A beam corresponding to a component emitted from the laser diode chip 100, transmitting through the collimating lens 200 and the 45-degree partial reflection mirror 300, and transmitting through the wavelength selective filter 400 arrives at the beam feedback, partial reflection mirror 500. A beam reflected on the beam feedback partial reflection mirror 500 in the beam arriving at the beam feedback partial reflection mirror 500 again transmits through the wavelength selective filter 400 and the 45-degree partial reflection mirror 300, transmits through the collimating lens 200, and is fed back to the laser diode chip 100. Therefore, an extension cavity type laser including the laser diode chip 100, the collimating lens 200, the wavelength selective filter 300, and the beam feedback partial reflection mirror 500 is completed. When a beam having a wavelength transmitting through and selected by the wavelength selective filter 400 is fed back to the laser diode chip 100, a wavelength of a laser beam emitted from the laser diode chip 100 is locked to a beam having a wavelength transmitting through the wavelength selective filter 400, through an amplification process. Therefore, when the external, cavity type laser is completed, such that a wavelength-locking phenomenon occurs, most of the laser beam emitted from the laser diode chip 100 becomes a laser beam transmitting through the wavelength selective filter 400. However, a wavelength at which wavelength locking is actually generated is not a wavelength having the highest transmissivity in the wavelength selective filter 400, but is a Fabry-Perot mode of an external cavity within a transmission band of the wavelength selective filter 400.

Figure 4:
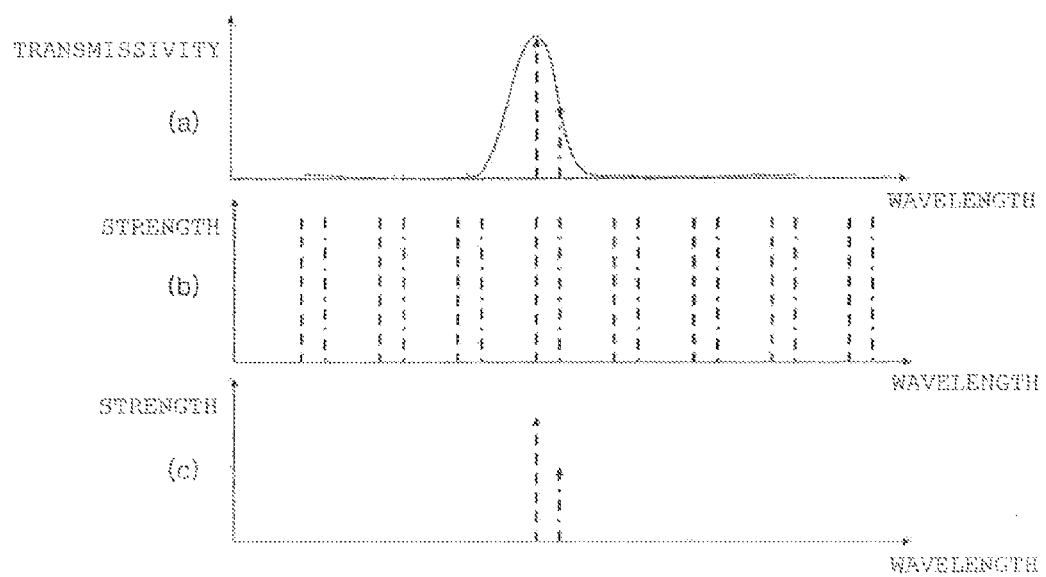
FIG. 4 is conceptual views illustrating an example FIG. 4(a) of a transmission band of a wavelength selective filter in which a transmission wavelength band is not relatively changed when a temperature of a thermoelectric element is changed in an external cavity type laser having a wavelength monitoring function according to the present invention, an example FIG. 4 (b) of a form in which a Fabry-Perot mode moves depending on the temperature of the thermoelectric element, and an example FIG. 4 (c) in which an optical output is changed depending on an allowed Fabry-Perot mode and a position of the transmission band of the wavelength selective filter.

FIG. 4 (a) illustrates a transmission spectrum of a transmission band of the wavelength selective filter 400. The wavelength selective filter shows a specific transmissivity for a specific wavelength with respect to wavelengths within a transmission band, and 1-transmissivity corresponds to a reflectivity and has a predetermined distribution of reflectivity with respect to wavelengths within the wavelength selective filter. Therefore, even at a Fabry-Perot mode wavelength within the transmission band of the wavelength selective filter, a transmissivity and a reflectivity of the wavelength-locked laser beam are changed depending on the Fabry-Perot mode and a relative position of the wavelength selective filter. FIG. 4 (b) illustrates an example of the Fabry-Perot mode determined by an entire resonator length of the external cavity type laser. A dotted line in FIG. 4 (b)

indicates a case in which the Fabry-Perot mode coincides with a wavelength having the best transmissivity in the wavelength selective filter, and a broken line in FIG. 4 (b) indicates a case in which the Fabry-Perot mode does not coincide with the wavelength having the best transmissivity in the wavelength selective filter. In the case in which the laser Fabry-Perot mode wavelength-locked and oscillated in the laser diode chip 100 coincides with the wavelength having the highest transmissivity in the wavelength selective filter 400, a strength of an output laser beam is increased as illustrated by a dotted line in FIG. 4 (c), and in the case in which the laser Fabry-Perot mode wavelength-locked and oscillated in the laser diode chip 100 does not coincide with the wavelength having the highest transmissivity in the wavelength selective filter 400, a strength of an output laser beam is decreased as illustrated by a broken line in FIG. 4 (c). The decrease in the strength of the output laser beam in FIG. 4 (c) means that an amount of beam, reflected on the wavelength selective filter 400 is increased, a reflected beam increased in the wavelength selective filter 400 as described above returns to the 45-degree partial reflection mirror 300, and a beam, having a ratio corresponding to a transmissivity of the 45-degree partial reflection mirror 300 is incident to the FMPD 700 below the 45-degree partial reflection mirror 300. Therefore, a strength of the beam incident to the FMPD 700 is changed depending on coincidence with a central wavelength of the Fabry-Perot mode wavelength based on a transmission band wavelength of the wavelength selective filter 400.

When a transmission band width of the wavelength selective filter 400 is excessively narrow, insertion loss of the beam transmitting through the wavelength selective filter 400 is increased, and when a transmission bandwidth of the wavelength selective filter 400 is excessively wide, it is difficult to effectively select one Fabry-Perot mode. Therefore, it is preferable that the transmission bandwidth of the wavelength selective filter 400 is appropriately set in order to decrease the insertion loss of the beam and effectively select the Fabry-Perot mode. In an exemplary embodiment of the present invention, the transmission bandwidth of the wavelength selective filter 400 is set to about 0.05 nm to 2 nm.

When a reflectivity of the beam feedback partial reflection mirror 500 is excessively low, an amount of beam fed back to the laser diode chip 100 for the purpose of the wavelength locking is excessively small, such that the wavelength locking of the laser is not generated well, and when a reflectivity of the beam feedback partial reflection mirror 500 is excessively high, a signal transmitting through the beam feedback partial reflection mirror 500 and used to transmit the beam becomes excessively weak. Therefore, it is preferable that the reflectivity of the beam feedback partial reflection mirror 500 is also set appropriately. In an exemplary embodiment of the present invention, the reflectivity of the beam feedback partial reflection mirror 500 is set to about 20% to 50%.

Figure 5:
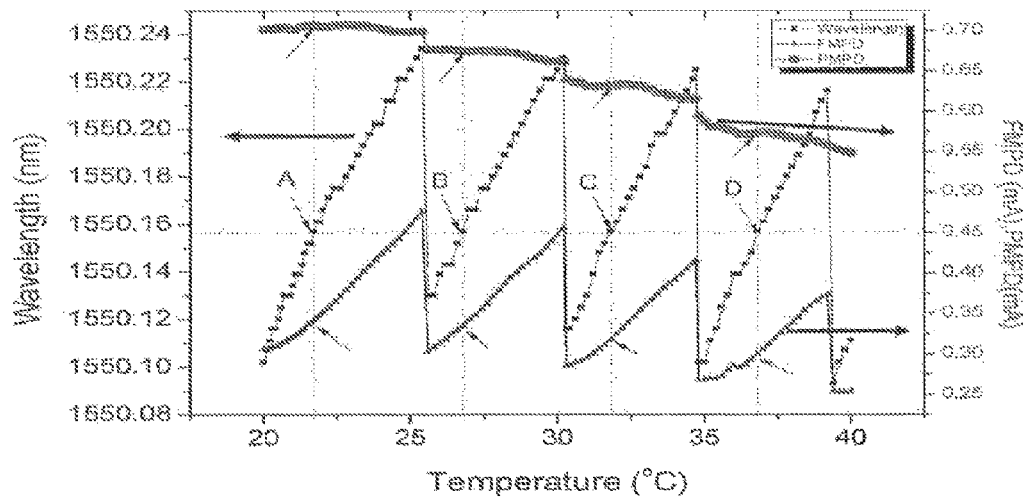
FIG. 5 is an example illustrating an oscillation wavelength and a photo-current flowing to a PM-PD and an FM-PD when the oscillation wavelength is changed by changing a temperature of a thermoelectric element mounted in a TO type package in the external cavity type laser having a wavelength monitoring function according to the present invention, depending on the temperature of the thermoelectric element.

FIG. 5 is a graph illustrating a wavelength oscillated in the laser and a photocurrent flowing to the PMPD 600 and the FMPD 700 when a temperature of a thermoelectric element 800 built in the TO type external cavity type laser, as a function of the temperature.

When the temperature of the thermoelectric element built in the external cavity type laser is changed, an effective refractive index in each portion of the external cavity is changed depending on the temperature. Therefore, the Fabry-Perot mode wavelength is changed. This wavelength change becomes a speed of about 20 pm to 40 pm/. However, since the wavelength of the wavelength selective filter 400 is changed at 1 to 2 pm/, when the temperature of the thermoelectric element 800 is changed, a transmission ratio of the wavelength selective filter 400 is changed based, on a transmission band wavelength spectrum of the wavelength selective filter. However, the strength of the laser beam oscillated in the laser diode chip 100 is not affected by a degree of wavelength tuning to the wavelength selective filter 400. In FIG. 5 corresponding to the case in which a current flowing to the laser diode chip is constant and the temperature of the thermoelectric element 800 is changed, a change in the photocurrent of the PMPD 600 depending on the temperature of the thermoelectric element 500 is due to a difference in beam emitting efficiency of the laser diode chip generated depending on the temperature. In FIG. 5, when the current flowing to the laser diode chip 100 is constantly maintained and the temperature of the thermoelectric element is increased, the photocurrent of the PMPD 600 shows a tendency toward a gentle monotone decrease. On the other hand, the photocurrent of the FMPD 700 shows rapid and repetitive characteristics. In FIG. 5, the photocurrent of the FMPD 700 depends on an output in the laser diode chip 100 and a reflectivity in the wavelength selective filter 400. Therefore, a change in an output strength of the laser diode chip 100 needs to be removed in order to calculate a wavelength of the laser beam based on the transmission band wavelength of the wavelength selective filter 400 by measuring the reflectivity in the wavelength selective filter 400.

Figure 6:
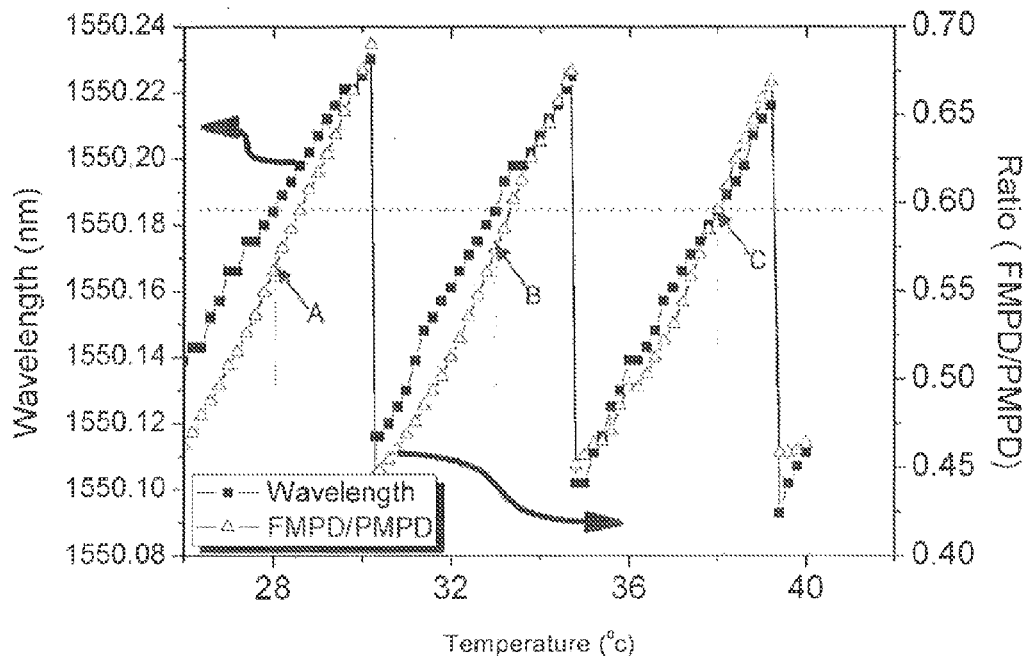
FIG. 6 is an example illustrating a ratio between an oscillation wavelength and a photo-current flowing to an FM-PD and a PM-PD depending on a change in the temperature of the thermoelectric element, when the oscillation wavelength is changed by changing a temperature of a thermoelectric element mounted in a TO type package in the external cavity type laser having a wavelength monitoring function according to the present invention.

FIG. 6 is a view illustrating a wavelength of the laser and values of a photocurrent of the FMPD 700/a photocurrent of the PMPD 600 based on the temperature of the thermoelectric element 800.

In FIG. 6, ratios between the wavelength of the laser and the photocurrents of FMPD/PMPD show a tendency to coincide very well with each other. Since the values of the FMPD/PMPD are not related to the output of the laser, the wavelength of the laser may be precisely figured out based on the transmission band wavelength of the wavelength selective filter 400 regardless of the current flowing to the laser diode chip.

Since the transmission band wavelength of the wavelength selective filter 400 is not affected by the current flowing to the laser diode chip 100, the wavelength of the laser beam, may be figured out based on the transmission band wavelength of the wavelength selective filter 400 regardless of a driving current of the laser diode chip 100, using this structure. These characteristics are effective even in the case in which a GaAs/AlGaAs wavelength selective filter showing a wavelength change ratio of 100 pm/is used as the wavelength, selective filter.

The wavelength selective filter 400 may be manufactured by stacking dielectric thin films having high and low refractive indices on a substrate made of glass, quartz, or the like, or may be manufactured by stacking a GaAs/AlGaAs layer on a GaAs substrate. In the case of the GaAS/AlGaAs wavelength selective filter, characteristics that a wavelength is changed depending on the temperature are strong. Nevertheless, the wavelength of the laser beam may be figured out based on a transmission wavelength, band of the GaAS/AlGaAs wavelength selective filter. Although not described in detail in a description of the present invention, it is obvious that in the case of using the thermoelectric element, a thermistor for measuring the temperature of the thermoelectric element may be added to one side above the thermoelectric element.

It is an obvious technical additional element to implement a predetermined wavelength of the laser beam by changing the temperature of the thermoelectric element in order to adjust the wavelength of the laser beam in the case of measuring the wavelength of the laser beam.

Figure 7:
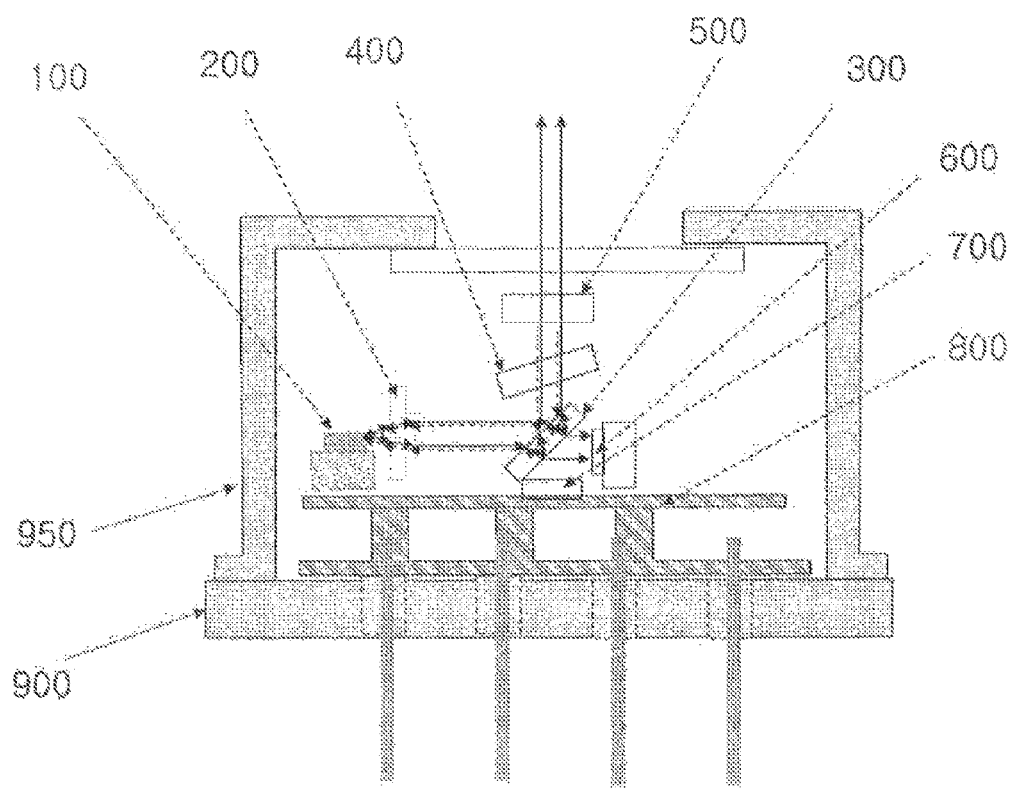
FIG. 7 illustrates a structure of an external cavity TO type laser package having a wavemeter according to the present invention.

FIG. 7 illustrates a structure of an external cavity TO type laser package having a wavemeter according to an exemplary embodiment of the present invention.

The present invention is not limited to the exemplary embodiment described above, but may be variously modified and altered without departing from the spirit and scope of the present, invention and equivalents to the following claims by those skilled in the art to which the present invention pertains.

[Description of Main Reference Numerals of Drawings]

| | |
|---|---|
| 100: laser diode chip | 110: sub-mount for laser diode chip |
| 200: collimating lens | 300: 45-degree partial reflection mirror |
| 400: wavelength selective filter | 500: beam feedback partial reflection mirror |
| 600: beam strength monitoring photodiode (PMPD) | |
| 610: sub-mount, for beam strength monitoring photodiode (PMPD) | |
| 700: beam strength monitoring photodiode (PMPD) | |
| 800: thermoelectric element | |
| 900: stem of TO type package | 950: cap of TO type package |

The invention claimed is:

1. An external cavity type laser apparatus comprising:
 a laser diode chip (100) emitting a laser beam;
 a beam feedback partial reflection mirror (500) reflecting a portion of the beam emitted from the laser diode chip (100) to feed the beam back to the laser diode chip (100);
 a collimating lens (200) installed on a path of a beam between the laser diode chip (100) and the beam feedback partial reflection mirror (500) to collimate the beam emitted from the laser diode chip (100);
 a 45-degree partial reflection mirror (300) converting a laser beam moving in parallel with a package bottom surface into a laser beam moving perpendicularly to the package bottom surface;
 a wavelength selective filter (400) transmitting a beam having a selected specific wavelength therethrough, wherein the wavelength selective filter is is manufactured by stacking a GaAs/AlGaAs layer on a GaAs substrate;
 a beam strength monitoring photodiode (600) disposed on a path of a beam moving from the collimating lens (200) to the 45-degree partial reflection mirror (300) and transmitting through the 45-degree partial reflection mirror (300); and
 a wavelength monitoring photodiode (700) disposed on a path of a beam moving from the wavelength selective filter (400) to the 45-degree partial reflection mirror (300) and transmitting through the 45-degree partial reflection mirror (300).

2. The external cavity type laser apparatus of claim 1, wherein the laser diode chip (100), the collimating lens (200), the 45-degree partial reflection mirror (300), the wavelength selective filter (400), the beam feedback partial reflection mirror (500), the beam strength monitoring photodiode (600), and the wavelength monitoring photodiode (700) are disposed above a thermoelectric element (800).

3. The external cavity type laser apparatus of claim 1, wherein the wavelength selective filter is manufactured by stacking dielectric thin films having high and low refractive indices on glass or quartz.

4. The external cavity type laser apparatus of claim 1, wherein a wavelength of the laser beam is figured out based on a transmission wavelength band of the wavelength selective filter using a value obtained by dividing a photocurrent flowing to the wavelength monitoring photodiode (700) by a photocurrent flowing to the beam strength monitoring photodiode (600).

5. An external cavity type laser apparatus comprising:
 a laser diode chip (100) emitting a laser beam;
 a collimating lens (200) to collimate the laser beam emitted from the laser diode chip (100) and installed adjacent to the laser diode chip (100);
 a 45-degree partial reflection mirror (300) for splitting the laser beam into a first beam moving in parallel with a package bottom surface and a second beam moving perpendicularly to the package bottom surface;
 a wavelength selective filter (400) disposed in a path transmitting the second beam having a selected specific wavelength therethrough;
 a beam feedback partial reflection mirror (500) reflecting a first portion of the second beam back through the wavelength selective filter (400) and the a 45-degree partial reflection mirror (300) and transmitting a second portion of the second beam;
 a wavelength monitoring photodiode (700) receiving the portion of the second beam reflected from the beam feedback partial reflective mirror (500); and
 a beam strength monitoring photodiode (600) receiving the first beam emitted from the laser diode chip (100) and transmitted through the 45-degree partial reflection mirror (400);
 wherein a wavelength of the laser beam is calculated based on a transmission wavelength band of the wavelength selective filter and using a value obtained by dividing a photocurrent of the portion of the second beam flowing to the wavelength monitoring photodiode (700) reflected from the beam feedback partial reflector mirror (500) by a photocurrent of the first beam flowing to the beam strength monitoring photodiode (600) and transmitted through the 45-degree partial reflection mirror (400).

6. The external cavity type laser apparatus of claim 5, wherein the laser diode chip (100), the collimating lens (200), the 45-degree partial reflection mirror (300), the wavelength selective filter (400), the beam feedback partial reflection mirror (500), the beam strength monitoring photodiode (600), and the wavelength monitoring photodiode (700) are disposed above a thermoelectric element (800).

7. The external cavity type laser apparatus of claim 5, wherein the wavelength selective filter is manufactured by stacking dielectric thin films having high and low refractive indices on glass or quartz.

8. The external cavity type laser apparatus of claim 5, wherein the wavelength selective filter is manufactured by stacking a GaAs/AlGaAs layer on a GaAs substrate.

* * * * *